United States Patent [19]

Yeung et al.

[11] Patent Number: 4,763,066

[45] Date of Patent: Aug. 9, 1988

[54] AUTOMATIC TEST EQUIPMENT FOR INTEGRATED CIRCUITS

[75] Inventors: Paul K. K. Yeung, Bothell; Alan D. Howard, Edmonds; James W. Hoo; James L. Pennock, both of Seattle, all of Wash.

[73] Assignee: Huntron Instruments, Inc., Lynnwood, Wash.

[21] Appl. No.: 910,483

[22] Filed: Sep. 23, 1986

[51] Int. Cl.[4] .................. G01R 19/165; G01R 19/10
[52] U.S. Cl. ........................... 324/73 R; 324/158 R; 371/25
[58] Field of Search .......... 324/73 R, 73 AT, 73 PC, 324/158 R; 340/715, 722; 371/25; 364/487

[56] References Cited

U.S. PATENT DOCUMENTS

| 3,889,053 | 6/1975 | Lloyd et al. ................. 324/158 R |
| 3,991,302 | 11/1976 | Danner ........................ 324/73 PC |
| 4,358,732 | 11/1982 | Johnston et al. ............. 324/158 R |
| 4,471,298 | 9/1984 | Frohlich ...................... 324/73 PC |
| 4,510,571 | 4/1985 | Dagostino et al. ................ 364/487 |
| 4,555,765 | 11/1985 | Crooke et al. .................... 364/481 |
| 4,565,966 | 1/1986 | Burr et al. ................... 324/73 PC |
| 4,631,699 | 12/1986 | Siwik et al. ........................ 371/25 |
| 4,641,246 | 2/1987 | Halbert et al. ................. 324/121 R |

FOREIGN PATENT DOCUMENTS

| 2856207 | 7/1980 | Fed. Rep. of Germany ... 324/121 R |
| 0066339 | 6/1977 | Japan ................................ 340/715 |
| 0637687 | 12/1978 | U.S.S.R. ......................... 324/121 R |
| 0646468 | 2/1979 | U.S.S.R. ......................... 324/121 R |

OTHER PUBLICATIONS

"Microcomputer-Based Power-Semiconductor-Circuit Waveform Analyser", by Pendergast et al, IEE Proc., vol. 127, pt. B, #6, 11/80, pp. 363-367.
"Advanced Waveform Recorders Do More Than Capture Transients"; by Dedinas, EDN, 9/5/78, pp. 103-110.

*Primary Examiner*—Reinhard J. Eisenzopf
*Assistant Examiner*—W. Burns
*Attorney, Agent, or Firm*—Graybeal, Jensen & Puntigam

[57] ABSTRACT

The apparatus (10) includes a semiconductor tester (12) which in operation produces an analog signature signal relative to a circuit node of an electronic circuit, such as a pin connection of an integrated circuit. The analog signature signal is the result of horizontal and vertical signals which are also directed to an integrator/A-D converter (44) which produces therefrom a set of four digital signals representing said analog signature. These digital signals are then compared in a computer (50) against reference digital values for the same circuit node of the same electronic circuit which is known to be good. If the digital signals are not within a selected range relative to the reference digital values, the analog signature of the circuit node is displayed for inspection and evaluation by an operator.

11 Claims, 7 Drawing Sheets

AUTOMATIC TEST EQUIPMENT FOR INTEGRATED CIRCUITS

TECHNICAL FIELD

This invention relates generally to test equipment for electronic circuits, and more particularly concerns test equipment which automatically produces an analog "signature" of selected nodes of the electronic circuit, such as the pins of integrated circuits, converts the signature signal into corresponding digital values and then compares those digital values with stored reference digital values developed from the same selected nodes of an electronic circuit known to be good.

BACKGROUND ART

The development of the integrated circuit (IC) has been one of the most significant technical advances in the twentieth century. Furthermore, continuing research and development has produced successive significant advances. In application, several integrated circuits are often combined on a single circuit board to form electronic systems. Further, such circuit boards are also connected together electrically to form complex electronic systems/apparatus. The use of such circuit boards is advantageous in that they may be conveniently replaced when one or more of the individual ICs on the board degrades or fails.

The advances of integrated circuit technology, however, have brought the challenge of quality control and circuit repair. This requires apparatus and methods which are specially adapted for testing the operating condition of electronic circuits which include individual ICs, as well as other circuit elements, both active and passive, which are connected to the ICs.

The importance of quality control is self-evident, as the replacement of inoperative boards due to IC failure is expensive, as well as requiring substantial valuable time of trained personnel. Prompt and accurate repair of circuit boards is also becoming increasingly important, again due to the cost of repair time, as well as the large number of expensive circuit boards.

One significant difficulty in the repair of circuit boards is that a board may be rendered inoperative by the failure of a portion of an IC or just one or more other circuit components, which may be difficult to locate, particularly in-circuit. A large number of circuit nodes, including the individual pin connections of the ICs, typically must be tested to identify the circuit faults.

Apparatus for testing integrated circuits is known, and insofar as they are designed to provide an automatic sequential interrogation of the individual pin connections of an IC under test without operator intervention, such apparatus is referred to as automatic test equipment (ATE). However, such equipment, which is available from only a few manufacturers, have the significant limitations of being expensive and quite sophisticated in operation (usually also including sophisticated software), as well as requiring a trained operator. Further, even such expensive and sophisticated equipment have proven to be somewhat unreliable with respect to accurately ascertaining the condition of the circuit under test and identifying its faults.

As an alternative to expensive and sophisticated ATE, relatively inexpensive semiconductor testers have been developed which have proven to be extremely useful for an individual technician who is involved in the repair or "troubleshooting" of integrated circuits and other semiconductor devices. Such apparatus is disclosed in U. S. Pat. No. 3,973,198, issued on Aug. 3, 1976 in the name of Bill Hunt, and U.S. Pat. No. 4,074,195, issued on Feb. 14, 1978, also in the name of Bill Hunt, both of which are owned by the assignee of the present invention.

The apparatus described in the above two patents includes circuitry which obtains an analog "signature" representating the operating condition of individual semiconductor junctions when the junction is in-circuit. The analog signature is displayed on a CRT, which is typically an integral part of the apparatus. A trained operator can interpret the signature to identify failed junctions or components. The relatively low cost of the apparatus permits its purchase in large numbers by organizations having large repair facilities as well as by individual technicians.

However, a significant disadvantage of such an instrument in some instances, such as in the testing of ICs, is that the testing must be done manually, i.e. pin-by-pin. The operator is at least required to inspect the displayed signature of each pin of the IC under test and in some cases must manipulate test leads or switching equipment manually for each IC pin connection.

Testing of circuit boards which include a number of ICs is thus quite slow with such apparatus, which may in effect preclude the use of such apparatus in many applications, including quality control, even though the information that may be obtained about the condition of the ICs and other circuit components by use of the apparatus is more complete and reliable than that obtained by much more expensive and sophisticated test equipment. Another disadvantage is that such apparatus typically does require a trained operator, who must examine the signature of each junction and make a judgment as to whether it is satisfactory.

Thus, there is a need for test equipment which is substantially as fast as, but less expensive than, existing ATE and which reliably and accurately tests integrated circuits and other elements in electronic circuits, including identifying those circuit nodes in the electronic circuit having signatures which are sufficiently different than normal to merit further evaluation.

DISCLOSURE OF THE INVENTION

Accordingly, the present invention is an apparatus for testing electronic circuits which comprises: means for connecting an electronic circuit to be tested to the testing apparatus; means for developing an analog signature signal for selected circuit nodes of the electronic circuit being tested, the analog signature being indicative of the operating condition of the circuit relative to the selected node; means for producing a digital value representative of said analog signature; means for establishing and storing reference digital values; and means comparing the digital representation for each selected circuit node obtained by the testing apparatus from the electronic circuit under test with reference digital values for those same circuit nodes of the same electronic circuit and then identifying those circuit nodes which do not have a digital representation which is within a selected range relative to said corresponding reference digital values.

BEST MODE FOR CARRYING OUT THE INVENTION

The present invention combines the functions of an analog signature semiconductor tester, such as that shown and described in the '198 and '195 patents, with apparatus capable of providing an automatic comparison of the signatures of successive nodes of an electronic circuit (system) under test against a previously stored standard, referred to as reference values. The system under test will typically comprise a circuit board which includes a number of separate integrated circuits as well as other active circuit components such as transistors and diodes and passive components such as resistors, capacitors and inductors.

This requires the conversion of the analog signatures developed from the circuit nodes into corresponding digital values, as well as the establishment of reference digital values for each circuit node in the system under test, wherein the reference values are typically developed from a known good circuit board. The apparatus of the present invention, typically utilizing a personal computer, automatically compares the digital values of each circuit node of the system under test with the stored reference values, under the control of system firmware and software. Any differences outside of a given range for a particular node results in the analog signature for that node being displayed for evaluation by an operator.

Figure 1:
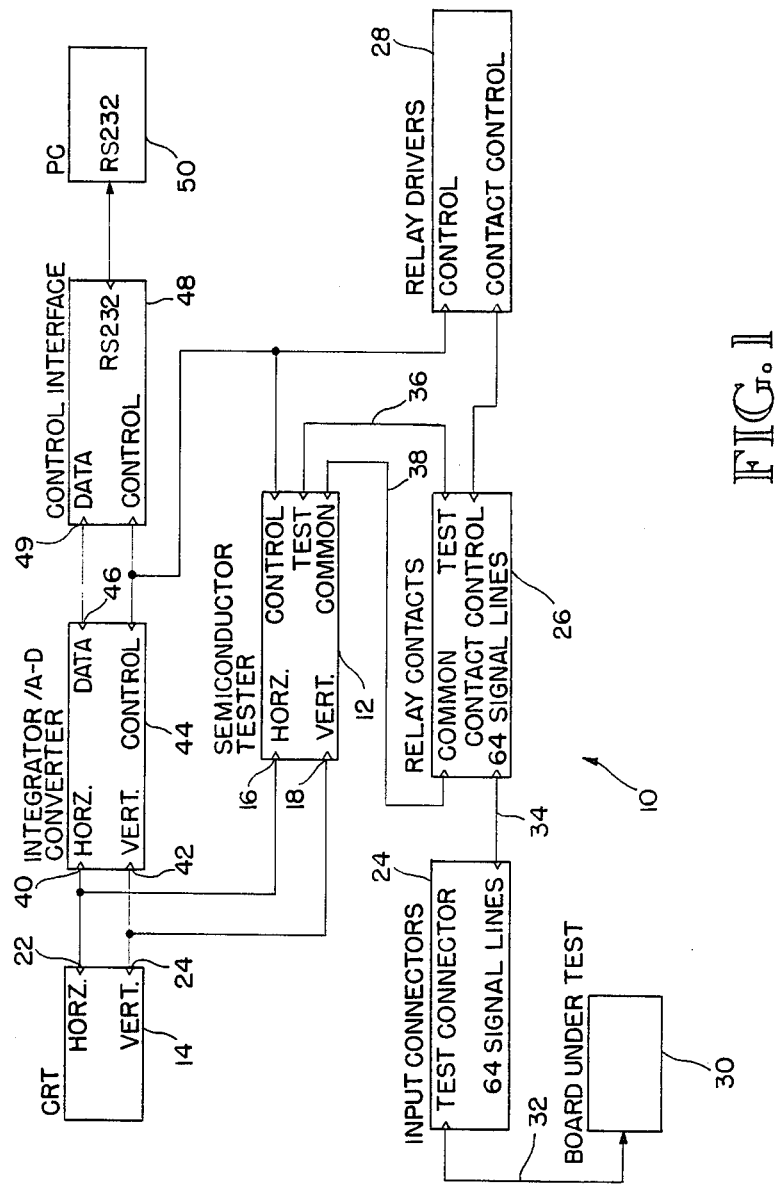
FIG. 1 is a block diagram of the apparatus of the present invention.

FIG. 1 is a structural block diagram of the ATE apparatus of the present invention, referred to generally at 10. The ATE apparatus 10 includes a semi-conductor junction test instrument 12, which is designed to provide a visible analog signature of a selected circuit node. The visible analog signature is a display on a CRT 14, which is typically integrated into the test instrument 12. The analog signature is the response of the system under test at the selected circuit node to an interrogating signal from the test instrument 12. The test instrument 12 supplies the interrogating signal, and produces "horizontal" and "vertical" output signals at outputs 16 and 18 thereof. The characteristics of these output signals depends upon the condition of the circuit, relative to the selected node.

The signals are applied, respectively, to the horizontal and vertical inputs 22 and 24 of the CRT 14. The horizontal and vertical signals produce the analog signature on the CRT 14. A semiconductor tester generally suitable for use in the present apparatus is shown and described in the '198 and '195 patents, which are hereby incorporated by reference.

The signal information used by the semiconductor tester 12 to produce the horizontal and vertical output signals is obtained by means of a set of input connectors 24 located on the face of the instrument, as well as a set of relay contacts 26, and a set of relay drivers 28. In the embodiment shown, there are four input connectors, each of which corresponds to a particular configuration of IC, including a 40 pin zero insertion force (ZIF) connector for dual-in-line (DIP) packages, a 20 pin connector for cabling to ICs with 20 pins or less; a 40 pin connector for cabling to ICs with 40 pins or less, and a 64 pin IDC connector for cabling to ICs with 64 pins or less. It should be understood, however, that other input connectors could be provided, including edge connectors. The purpose of the input connector is simply that of a connection device to provide unique connection to each pin of the IC.

Typically, the particular circuit nodes to be tested of the system under test are the pin connections of integrated circuits on the circuit board, so that the connection devices of the present apparatus are typically arranged to accommodate integrated circuits. However, electronic probes, either fixed or movable, could be used to connect the test apparatus of the present invention to the circuit nodes to be tested as well. Conceptually, a large number of fixed probes could be used to provide a so-called "bed of nails" connection approach to a given circuit board under test.

Typically an individual IC of the circuit board under test is connected to the correct corresponding input connector by means of a cable 32 which has a socket on the end thereof which is adapted to receive the IC to be tested. The input connector circuit block 24 includes 64 output signal lines, one for each pin connection for the IC having the largest number of connections to be tested, which is in the embodiment shown is 64. It should be understood, however, that more connections, i.e. 4096 and more, could be provided, to accommodate other ICs.

The signal lines from input connector block 24 extend into relay contact circuit 26. The relay contact circuit 26 in the embodiment shown comprises two banks of 64 relays. Such an arrangement permits any one of the 64 signal lines from the input connector circuitry to be routed to the test line and/or common line outputs 36 and 38 of the relay contact circuit and then to corresponding inputs of the semiconductor junction tester 16.

The relay driver circuit 28 controls the operation of the relays in the relay circuit 26 in conventional fashion, under the control of the control interface circuit 48 which contains the system control firmware, which in turn will be explained in more detail hereinafter.

The semiconductor tester 12 provides an excitation (interrogation) signal, such as a triangle wave or a sinusoid, through the relay contact circuit 26 and the input connector 24 to one circuit node (pin connection) of the system under test. The test line 36 is for the pin connection to which the test signal is applied, while the common line 38 is connected to a reference pin of the IC. The tester 12 produces horizontal zontal and vertical signals at outputs 16 and 18, in response to the excitation signal directed to the individual circuit node. Those signals are then applied to the horizontal and vertical inputs 22 and 24 respectively of the CRT 14, which as mentioned above is typically integrated into the semiconductor tester.

The analog signals at outputs 16 and 18 of the semiconductor tester 12 are also applied to horizontal and vertical inputs 40 and 42 of the integrator/A-D converter circuit 44. These analog signals could, as an example, be sinusoids of different (or the same) magnitudes. However, these signals must be converted to a digital format for processing by the remaining circuitry of the present invention. The function of the integrator- /A-D converter circuit 44 is to produce digital signals representative of the analog signals at inputs 40 and 42.

Digitizing the analog signals at high sampling rates in conventional fashion requires a substantial amount of memory and would slow the signal proccessing. In the embodiment shown, the digital values are obtained by first separating the analog signals into their respective positive and negative components over one cycle. Each component is then integrated over a fixed time interval, using standard analog integration circuitry, to produce a DC voltage proportional to the area under the curve of the positive and negative components of each signal. This integrated signal is sampled and temporarily stored and then converted into a digital signal.

These functions all occur within the one circuit 44, and are accomplished for the positive and negative components of each signal, so that for one cycle, i.e. zero to $2\pi$, four digital values result. These four digital values comprise the digital representation of the analog signature of the particular circuit node being tested.

The digital signals from the integrator/A-D converter 44 are then applied over a data line 46 to a control interface section 48. The control interface section 48 is "intelligent" in the sense that it contains firmware in the form of a microcomputer with a stored program in a programmable read-only memory (PROM). Section 48 functions as an interface between the computer 50 and the rest of the apparatus. Communication with the computer 50 is by a standard RS-232 interface. In operation, section 48 receives instructions from the software in the computer 50 and executes those instructions, thereby controlling the operation of the apparatus, specifically, the timing and operation of the relay contacts 26, the relay drivers 28, the semiconductor tester 12, and the integrator/A-D converter 44. The operation of the control interface 48 and the firmware therein will be described in more detail hereinafter.

The digital values at the data input 49 of the interface section 48 are applied to the computer 50 through the ports of the RS-232 interface. In the embodiment shown, the computer 50 is an IBM personal computer which, under the control of application software, compares the digital values obtained by the test instrument for a particular circuit node with stored reference digital values for the same circuit node for a known good board. The software in the embodiment shown includes five modules, including a structure module, a test module, a learn module, a report module, and a system function module. The software will be described in more detail below.

In the function of the apparatus, data in the form of reference digital values is stored in the memory of the computer 50 for each circuit node of the electronic system to be tested by the apparatus. The stored reference digital values are those known to be good and are typically established by actually testing an electronic circuit known to be operable and then storing those tested digital values. In a possible alternative embodiment, the apparatus could be arranged to directly receive and store reference digital value information, which may, for instance, be supplied by a manufacturer of the particular circuit. The reference values are usually in the form of a range, or accepted band, i.e. high/-low.

As the same circuit board is tested in actual use of the apparatus, actual operable values may be discovered which are outside the originally established range. The reference value range may then be modified accordingly, if desired.

These reference ranges are in effect maximum and minimum digital values, and are referred to as "an envelope" of acceptable reference values. As described above, the envelope will typically gradually increase in use of the apparatus, as the total number of tests by the apparatus increases. Thus, the more testing of a particular system, the more accurate the boundaries of the envelope will become, if the testing results are "learned" by the computer, i.e. if the stored reference values are changed accordingly. The high/low range envelopes for each of the four digital values for each system under test is thus stored in memory in computer 50. Each circuit board or other system under test has such information in memory.

In the actual test procedure, circuit boards 30 containing individual ICs to be tested are connected by an appropriate connector clip through a connecting line 32 to the corresponding input connector 24. The various pin connections of the IC are then automatically processed in sequence by testing each node/pin connection and developing a set of four digital values for each circuit node representative of the analog signature thereof, as explained above.

The set of digital values for each pin connection of the IC are then supplied to the PC 50, where each set of digital values is compared with the reference digital values for that node (pin connection) in memory. Each node having digital values which fall outside the envelope of stored reference values is flagged, and at the end of the testing of the system, the complete analog signature of each questionable pin connection of each IC is presented for review by the operator. Typically, but not necessarily, the circuit node having the worst, or most different, values, will be presented first; i.e. the circuit nodes to be reviewed are prioritized in terms of quality.

The analog signature of each questionable circuit node is displayed on the CRT 14, permitting the review which the semiconductor tester 12 typically provides to the operator for evaluation of a particular junction. If the analog signature developed at a given pin connection in the system under test is determined to be bad by the operator, then that IC is replaced. The circuit board may then be tested functionally to determine whether or not the fault has been corrected.

The above process continues for each IC in turn for the board being tested. The testing process is automatic, and thus quite fast, in the first step of the test procedure, in which the apparatus accomplishes the testing of each selected circuit node. The questionable pin connections are then reviewed by the operator in detail, in the second testing step. The overall testing procedure is thus substantially automatic, because relatively few pin connections for a given IC will be questionable, requiring operator review.

Figure 2A:
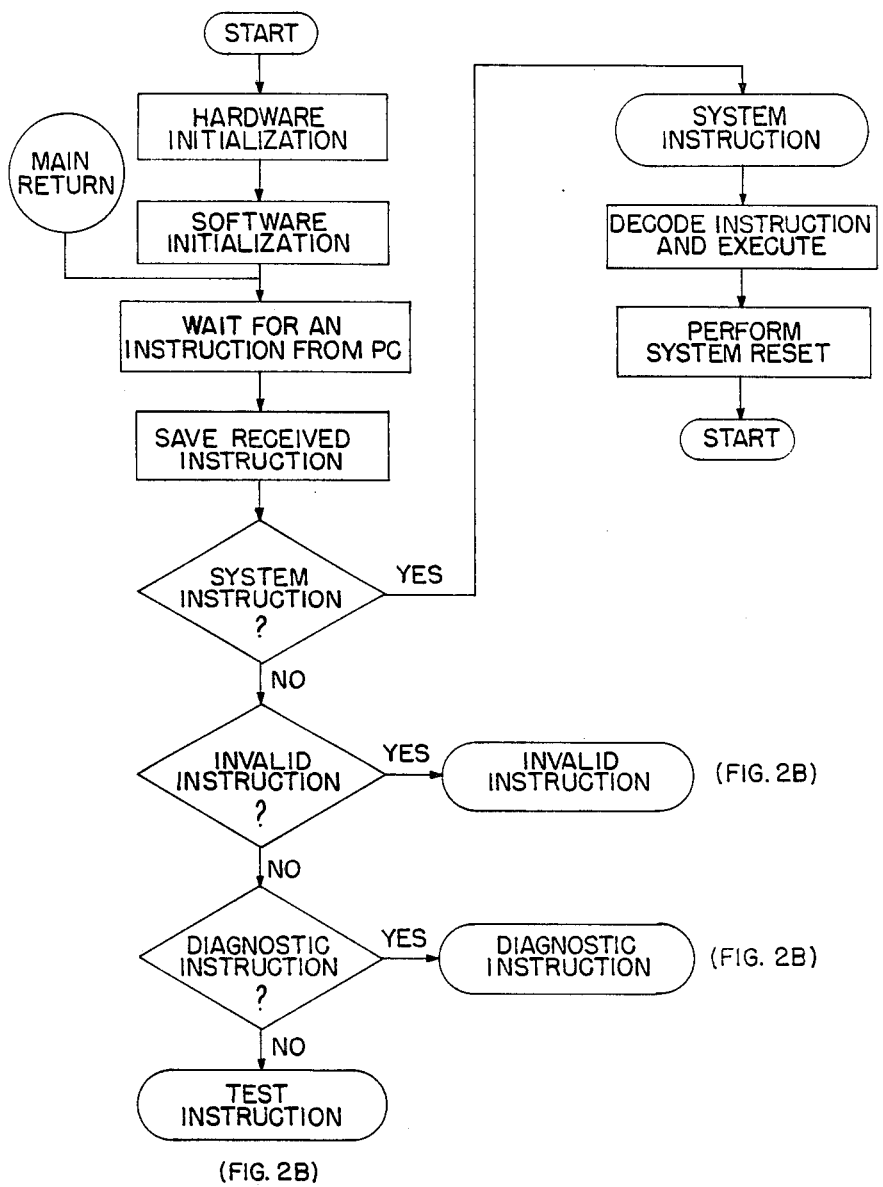
FIGS. 2A-2B are flow chart diagrams of the firmware which controls the overall operation of the apparatus of FIG. 1.
Figure 2B:
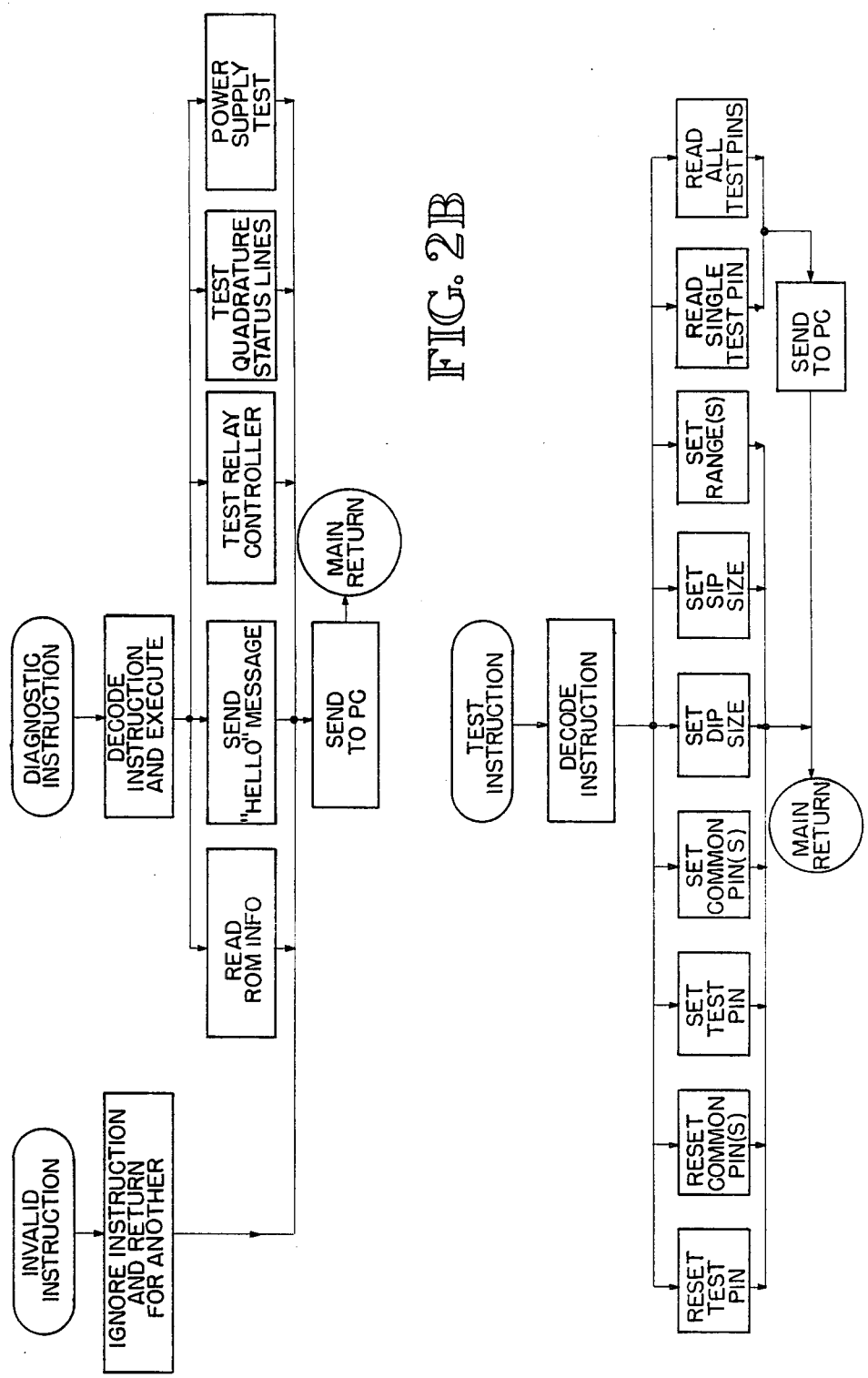

FIGS. 2A–2B show a flow chart for the firmware in the control interface 48. The interface 48 receives instructions from computer 50, executes those instructions, if valid, to control the various sections in the apparatus, and transfers the digital values for the particular node being tested generated by the integrator/A-D converter 44 to the computer 50 for actual processing.

At the start of operation of the apparatus, the system hardware is first initialized via the firmware, including the timers, the relays and the various data ports. The hardware is initialized by setting the lines to their proper state and clearing/loading the memories and registers. The firmware then waits for an instruction from the software.

When an instruction is received, it is saved in memory. The instruction is then processed to determine first whether it is a system instruction. If it is, then the system instruction subroutine is implemented. The system instruction subroutine is a reinitialization of the hardware and software. If it is not a system instruction, the instruction is processed to determine whether or not it is an invalid instruction. If it is, the invalid instruction subroutine (FIG. 2B) is implemented. The invalid instruction is ignored and the system returns for the next instruction.

If it is not an invalid instruction, there is an inquiry as to whether the instruction is diagnostic. If the instruction is diagnostic, it will be one of the instructions shown in FIG. 2B. The diagnostic tests verify operability of certain hardware elements. For instance, by reading the ROM information, the correct program information for that ROM can be verified. The "Hello message" test verifies the communication link between the computer 50 and the rest of the apparatus. The test relay controller test results in a checking of whether or not the relay control logic is functional. The power supply test instruction tests the voltages on the circuit cards while the quadrature status instruction tests the integrator/A-D converter.

Referring to FIG. 2B, if the instruction is a test instruction, it is first decoded and then it is executed. The various test instructions are shown in the flow chart. The size of the dual-in-line (DIP) or single-in-line (SIP) connectors is first set. The range for the tester is then set and the test and common pins are set or reset as required. The appropriate relay contacts close accordingly and the analog signature signal is developed and then converted into corresponding digital values, as explained above. The read test pin instruction then transfers the digital test values to the PC 50 for comparison with the reference digital values. This processing is carried out by the software in the computer 50.

The flow chart for the software in the computer puter 50 is shown in FIGS. 3A-3D. In the embodiment shown, computer 50 is a microcomputer, such as an IBM PC, XT, or AT, and the software is provided on a floppy disk. As shown in the flow chart, there are three basic operation modes, encompassing five main routines, including a system routine which concerns security matters such as passwords and the like. The three modes include a "structure" mode, a "learn" mode and a "test" mode. In the embodiment shown, each mode has a menu format which is used to guide the user through the operation of the mode. There is a master menu for each mode and also a menu for each routine or utility program in the mode. Each mode typically will consist of 1 or 2 principal routines and several utility programs.

The structure mode comprises those routines and programs (FIG. 3A) by which the apparatus obtains information concerning the structure of the systems to be tested. The information is divided into a hierarchy. "System" refers to the identity of the complete apparatus, such as for example an IBM PC; "unit" refers to a separate portion of the system, such as a printer or keyboard; "board" refers to the particular circuit board in the unit; "section" refers to a functional circuit within the board, such as a power supply, and "comp", for component, refers to an element in the section, such as a particular IC or other component.

Identifying information is provided to the computer 50 about each of the above under the "enter structure" routine, as well as special instructions. The amount of disk space that the above information requires is automatically calculated by the software. For instance, the number of pins, the identification of the common pins and the manufacturing date of the board is typical information provided about the board. Under both the system and the unit headings, only the name of the system/unit and the number of units/boards comprising the system/unit are provided. The "add to structure" and "edit structure" routines permit the operator to add or edit information relative to each portion of the structure.

Figure 3A:
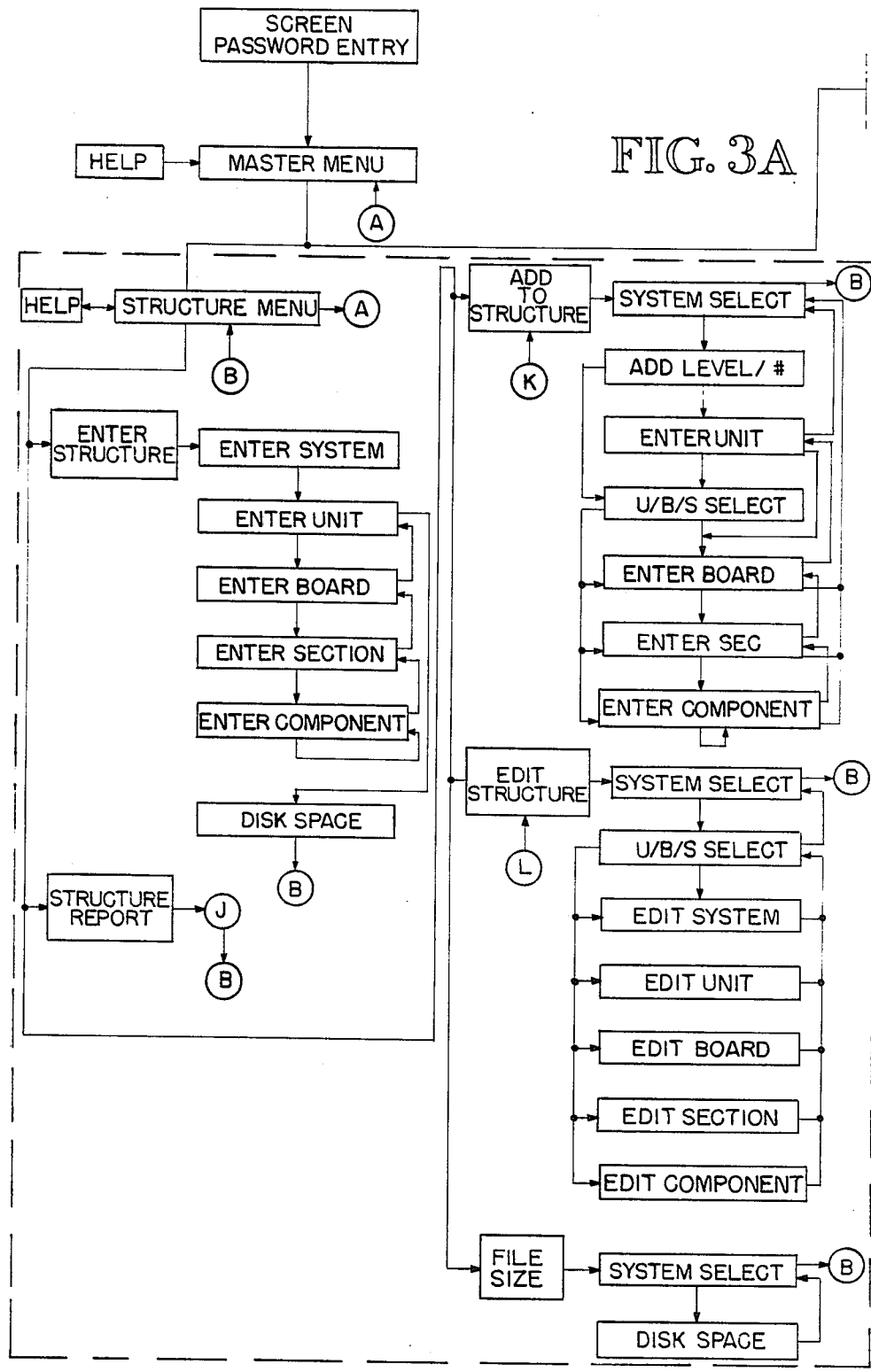
FIGS. 3A-3D are flow chart diagrams of the software which controls the testing of the electronic system under test.
Figure 3B:
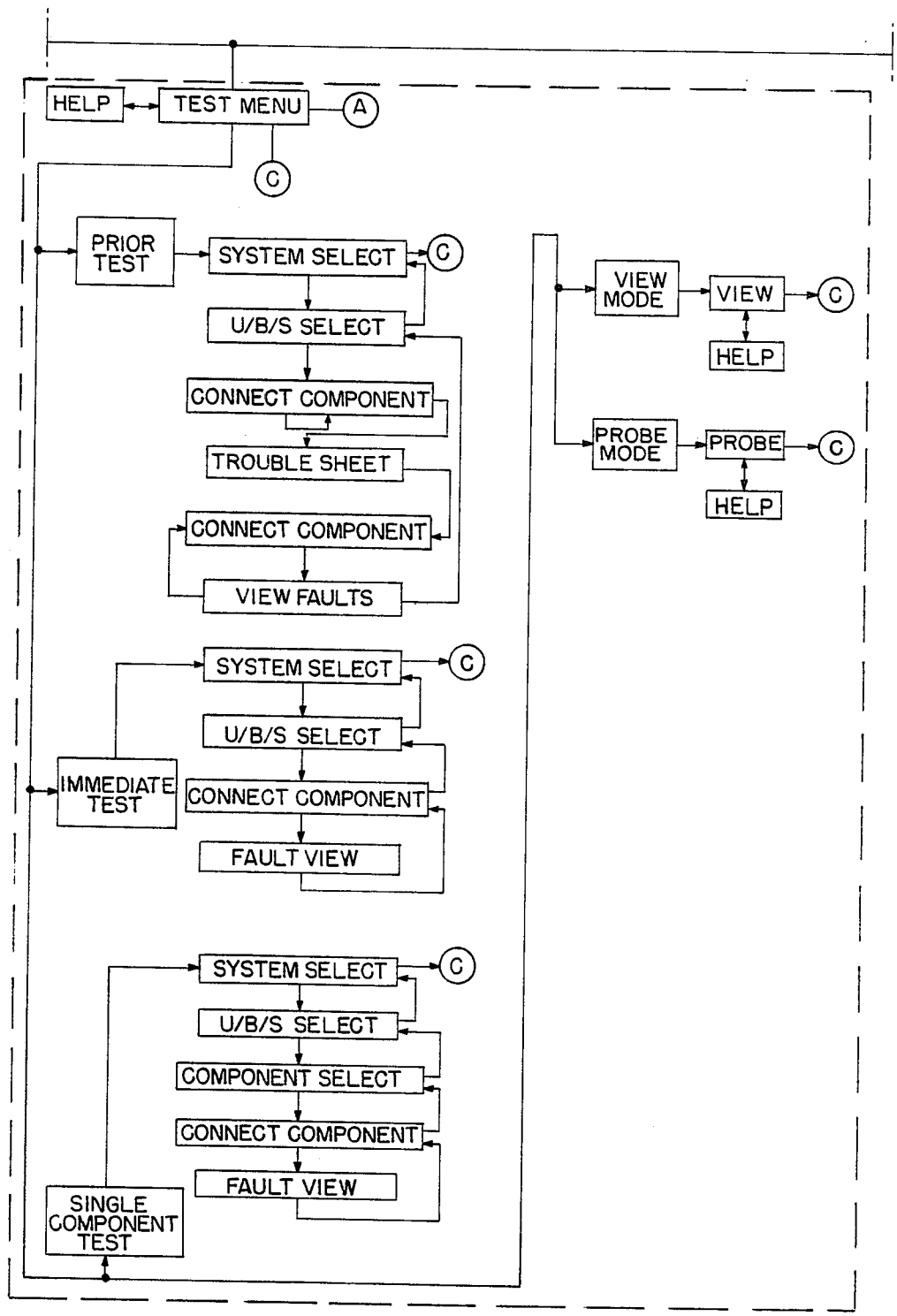
Figure 3C:
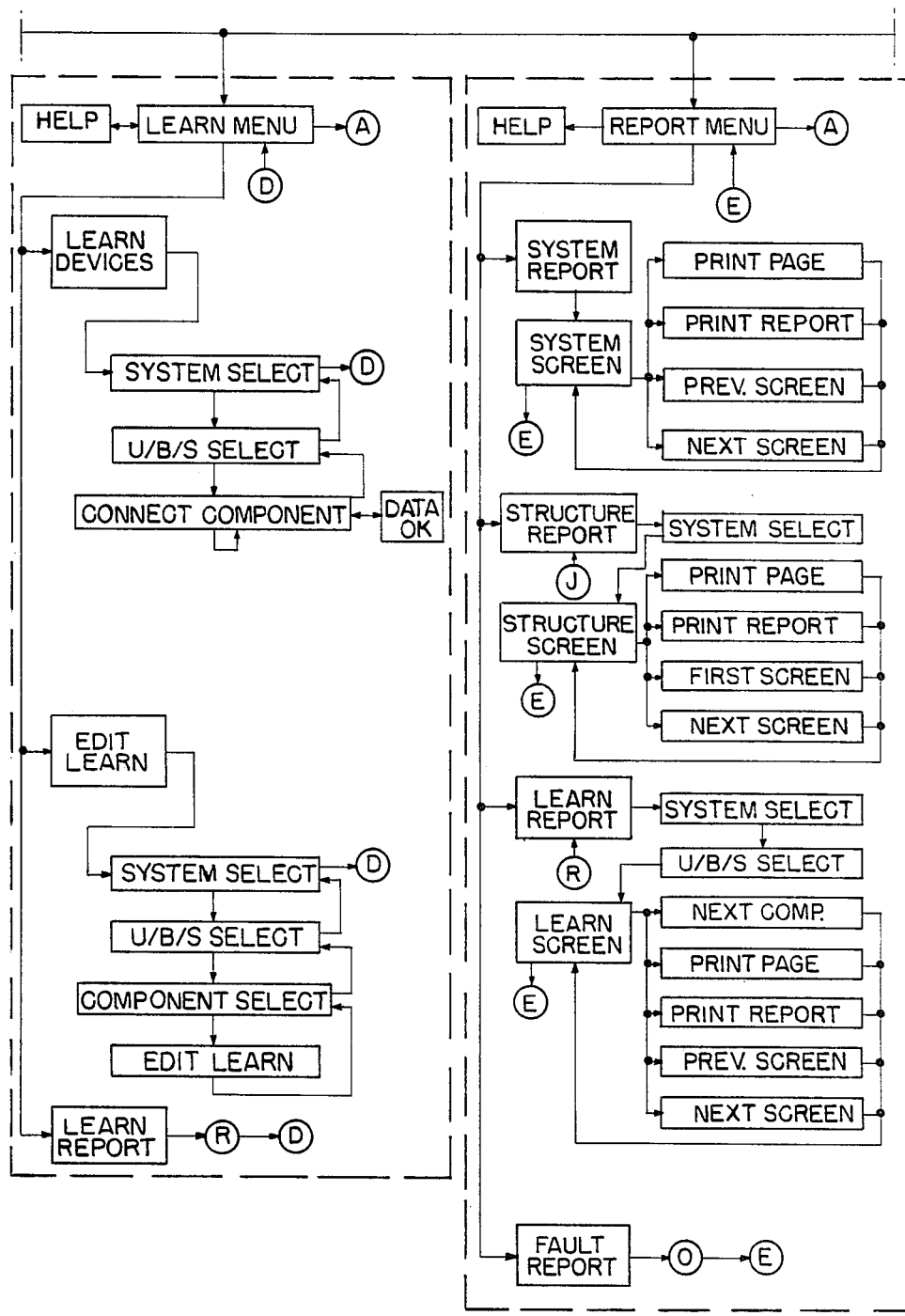
Figure 3D:
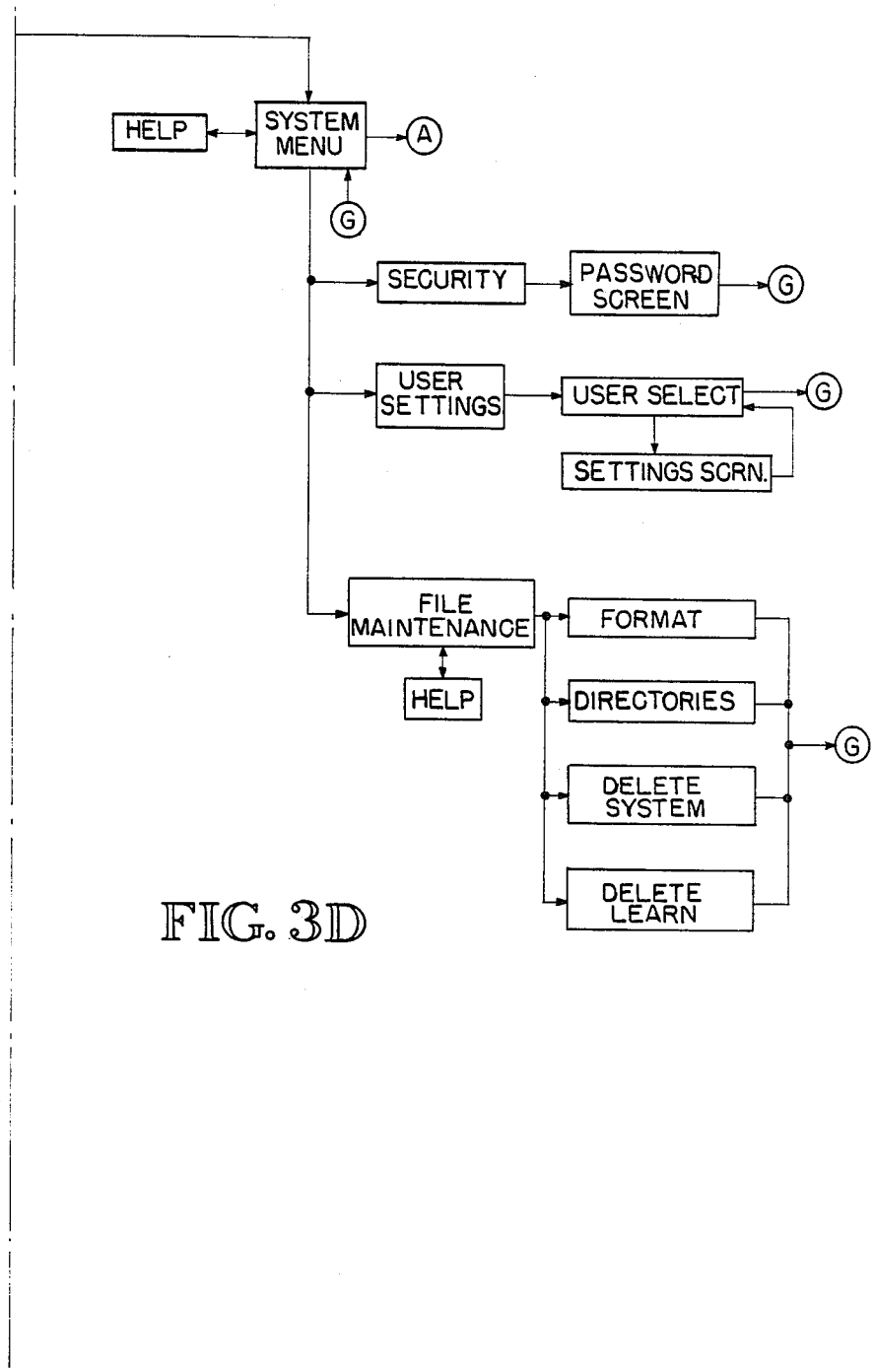

In the "learn" routine, as shown in FIG. 3C, the reference digital values for each IC are developed. This is accomplished typically by connecting an operable IC to the apparatus through the input connectors 24 and obtaining digital values concerning each circuit node. The name for the system is first entered, i.e. such as an IBM PC, and then the names of the unit, board and section. The digital values for the circuit node are then transferred into memory and become the reference digital values. If the learn mode is to be used beyond this initial establishment of information of the same system, a comparison is made between the new values and the originally stored values, and an indication is provided if the originally stored values are exceeded. The new values are not entered unless the operator operates the "data OK" key. This provides a safety feature to protect the reference values.

The software then requests certain information concerning the component source of the new values, including the manufacturer, the date of manufacturer and the I.D. number of the board.

In the edit routine, the learned values remain unchanged, but identifying information concerning the learned board, such as the name of the component manufacturer, the date of component manufacture, etc. may be changed.

In this particular embodiment, the software is somewhat limited so boards are learned by sections, even though the identification is on the basis of an entire board. This should not, however, be considered a limitation on the scope of the invention.

In the "test" mode, the apparatus performs a test on the electronic circuit under test at a selected circuit node, as described above. The test mode includes three test methods, including a prioritized fault test method, an immediate fault test method, and a single component test method. The test mode further includes a "view" operating mode, which permits the operator to view the analog signature of any circuit node, without any data comparison or other function, and also includes a "probe" operating mode, in which relays are disabled so that only the probes of the apparatus are energized.

In the prioritized fault test method, all the circuit nodes in one section are first tested. Then a troublesheet listing in a priority order, beginning with the most different, the nodes which did not fall within the reference ranges is prepared. The analog signatures for those nodes are then viewed in that priority order.

In the immediate fault test method, each circuit node, i.e. pin connection, of a given IC in a selected section of a board is tested, but no troublesheet is developed. At the conclusion of the testing of the IC, those pins which did not pass the comparison are then viewed, typically in priority order.

The single component test enables the operator to test any one component on any one particular board. If a possible fault is determined, the analog signature of that component will be viewed.

In the report mode, which is set out in FIG. 3C, the operator may examine any of the stored files, either on the computer display or in printed form. In the system report, a list of the systems on file is displayed. In the embodiment shown, a single screen includes 20 systems. The screen information may then be printed, if desired.

In the "structure" report, the various units, boards, sections and components are shown in sequence. All the information in the file previously entered into memory concerning the particular structure selected may be viewed. In the learn report and learn screen routines, the information in the report or on the screen is learned by the apparatus, i.e. stored into memory as part of the file.

The software also contains a security routine by which the passwords are maintained. Further, the apparatus includes a hierarchy of software/hardware settings which may be varied by the user, depending on the sophistication of the user. In some instances, the settings will enable the user to make only relatively few changes, while in other instances, the user will be able to make several changes. File maintenance is also included. The format of the disks may be changed, entire systems may be deleted, or just certain data about the system may be deleted.

Thus, an apparatus has been disclosed for testing electronic circuits which combines an automatic test capability with a capability of reviewing analog signatures of selected circuit nodes, including the pin connections of an IC which is a part of the electronic circuit. The apparatus is fast, yet reliable in ascertaining circuit faults, and has the further advantage of being relatively inexpensive compared to existing automatic test equipment.

Although a preferred embodiment of the invention has been disclosed herein for purposes of illustration, it should be understood that various changes, modifications and substitutions may be incorporated in such embodiment without departing from the spirit of the invention as defined by the claims which follow.

We claim:

1. An apparatus for testing an electronic circuit, comprising:
    means for connecting an electronic circuit having an operating condition which is to be tested to said apparatus, said electronic circuit havinq a plurality of selected node points;
    means for automatically applying an electrical interrogation signal to said selected circuit node points in turn;
    means for automatically obtaining from said circuit node points in response to said interrogation signal two electrical signal waveforms, one of which is a current waveform and the other of which is a voltage waveform, both of which have positive and negative portions, wherein said two waveforms, when combined, form an analog signature which is indicative of the operating condition of the electronic circuit relative to said circuit node points and wherein the apparatus includes means for combining said two waveforms to produce said analog signature;
    means for integrating the positive and negative portions of one cycle of each of said two waveforms;
    means for generating four digital values representative of the integrated portions, respectively, of said two waveforms;
    means establishing and storing reference digital values for the selected circuit node points;
    means comparing the generated digital values for each selected circuit node point with the corresponding reference digital values therefore and identifying those circuit node points having a generated digital value which is within a selected range relative to said corresponding reference digital value; and
    means for producing and displaying the analog signature for those circuit node points which do not have a generated digital value within said selected range.

2. An apparatus of claim 1, wherein the circuit to be tested remains in-circuit and is in a power-off condition when tested, and wherein said interrogation signals are provided directly by the apparatus and not as a result of the circuit to be tested actually operating.

3. An apparatus of claim 1, wherein the electronic circuit to be tested includes integrated circuits and said connecting means includes means providing separate connections for each pin of each integrated circuit in turn in said electronic circuit.

4. An apparatus of claim 3, wherein said connecting means includes means for connecting said apparatus to a wide variety of integrated circuits.

5. An apparatus of claim 1, including means for entering and storing information concerning the electronic circuits to be tested.

6. An apparatus of claim 1, wherein the analog signature is obtained by applying one electrical signal waveform to a horizontal connection of a visual display device and the other electrical signal waveform to a vertical connection of the visual display device.

7. An apparatus of claim 1, wherein the reference digital values are obtained from an electronic circuit known to be good.

8. An apparatus of claim 1, wherein the displaying means includes means for displaying the analog signatures which are not within the selected range following the complete testing of at least one integrated circuit, the display of said signatures being in order from most different to least different relative to the selected range.

9. A method for testing an electronic circuit, comprising the steps of:
    connecting an electronic circuit having an operating condition which is to be tested to said apparatus, said electronic circuit having a plurality of selected node points;
    automatically applying an electrical interrogation signal to said selected circuit node points in turn;
    automatically obtaining from said circuit node points in response to said interrogation signal two electrical signal waveforms, one of which is a current waveform and the other of which is a voltage waveform, both of which have positive and negative portions, wherein said two waveforms, when combined, form an analog signature which is indicative of the operating condition of the electronic circuit relative to said circuit node points;
    integrating the positive and negative portions of one cycle of each of said two waveforms;
    generating four digital values which are representative of the integrated portions, respectively, of said two waveforms;

establishing and storing reference digital values for the selected circuit node points;

comparing the generated digital values for each selected circuit node point with the corresponding reference digital values therefore; and producing and displaying the analog signature obtained from those circuit node points which do not have a generated digital value within a selected range relative to said corresponding reference digital values.

10. A method of claim 9, wherein the reference digital values are obtained from an electronic circuit known to be good.

11. A method of claim 9, including the step of displaying the analog signatures which are not within the selected range following the complete testing of at least one integrated circuit, wherein the said signatures are displayed in order from most different to least different relative to the selected range.

* * * * *